United States Patent [19]

David

[11] Patent Number: 4,821,223
[45] Date of Patent: Apr. 11, 1989

[54] TWO-DIMENSIONAL FINITE IMPULSE RESPONSE FILTERS

[75] Inventor: Morgan W. A. David, Farnham, England

[73] Assignee: Sony Corporation, Tokyo, Japan

[21] Appl. No.: 910,523

[22] Filed: Sep. 23, 1986

[30] Foreign Application Priority Data

Oct. 4, 1985 [GB] United Kingdom ................. 8524533

[51] Int. Cl.$^4$ .............................................. G06F 15/31
[52] U.S. Cl. ......................... 364/724.05; 364/724.13; 364/724.16
[58] Field of Search .............. 364/724, 724.16, 724.13, 364/724.05, 724.01

[56] References Cited

U.S. PATENT DOCUMENTS

| 4,493,080 | 1/1985 | Campbell | 364/724 |
| 4,507,746 | 3/1983 | Fletcher, Jr. | 364/717 |
| 4,612,625 | 9/1986 | Bertrand | 364/724 |
| 4,623,980 | 11/1986 | Varg | 364/724 |
| 4,691,292 | 9/1987 | Rothweiler | 364/724 |
| 4,709,394 | 11/1987 | Bessler et al. | 364/724 |

FOREIGN PATENT DOCUMENTS 0190796 8/1986 European Pat. Off. .............. 36/724

OTHER PUBLICATIONS

Nussbaumer, "Discrete Transforms Filter", *IBM Technical Disclosure Bulletin*, vol. 18, #12, pp. 4048–4053, May 1976.
Crochiere et al., "Interpolation and Decemation of Digital Signals—A Tutorial Review", *Proc. of the IEEE*, vol. 69, #3, pp. 300–331, Mar. 1981.
Esteban et al., "HQMF: Halfband Quadrature Mirror Filters", Conference ICASSP 81, Proc. of the 1981 IEEE Int. Conf. on Acoustics Speed, and Signal Processing, Atlanta, GA USA, (Mar. 30–Apr. 1, 1981), pp. 220–223.

*Primary Examiner*—Gary V. Harkcom
*Assistant Examiner*—Dale M. Shaw
*Attorney, Agent, or Firm*—Lewis H. Eslinger

[57] ABSTRACT

A two-dimensional finite impulse response (FIR) filter comprises a demultiplexer for demultiplexing an input data signal comprising adjacent digital words into p (e.g. 2) slower data signals each having a slower rate equal to 1/p (e.g. ½) of the data rate of the input signal and each comprising every $p^{th}$ (e.g. every alternate) word of the input signal. The slower data signals are passed to p (e.g. 2) filter portions each comprising a horizontal FIR filter and a vertical FIR filter. The horizontal filters are each connected to receive all of the slower data signals and all of them are operative simultaneously to effect horizontal filtration by periodically processing sets of adjacent words of the input signal, the sets of adjacent words being processed at any one time by the respective horizontal filters being offset with respect to one another by one word. A multiplexer receives output signals of the filter portions to form a filtered output data signal having a data rate equal to that of the input data signal.

4 Claims, 9 Drawing Sheets

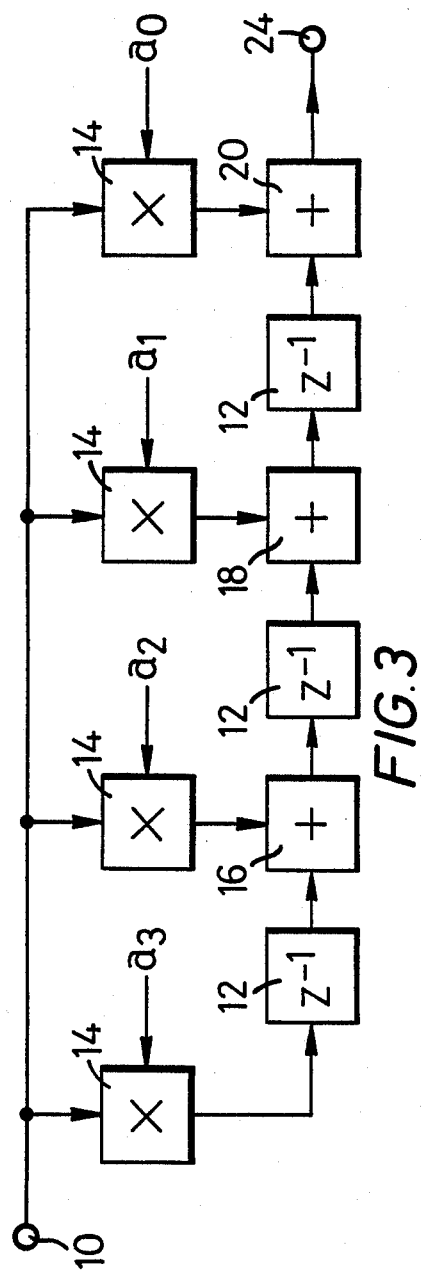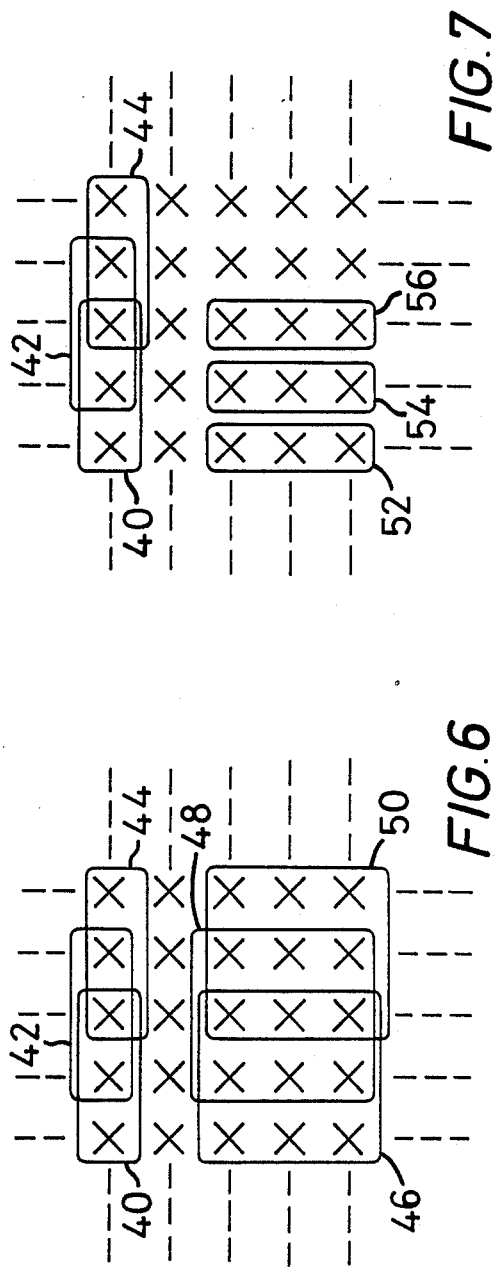

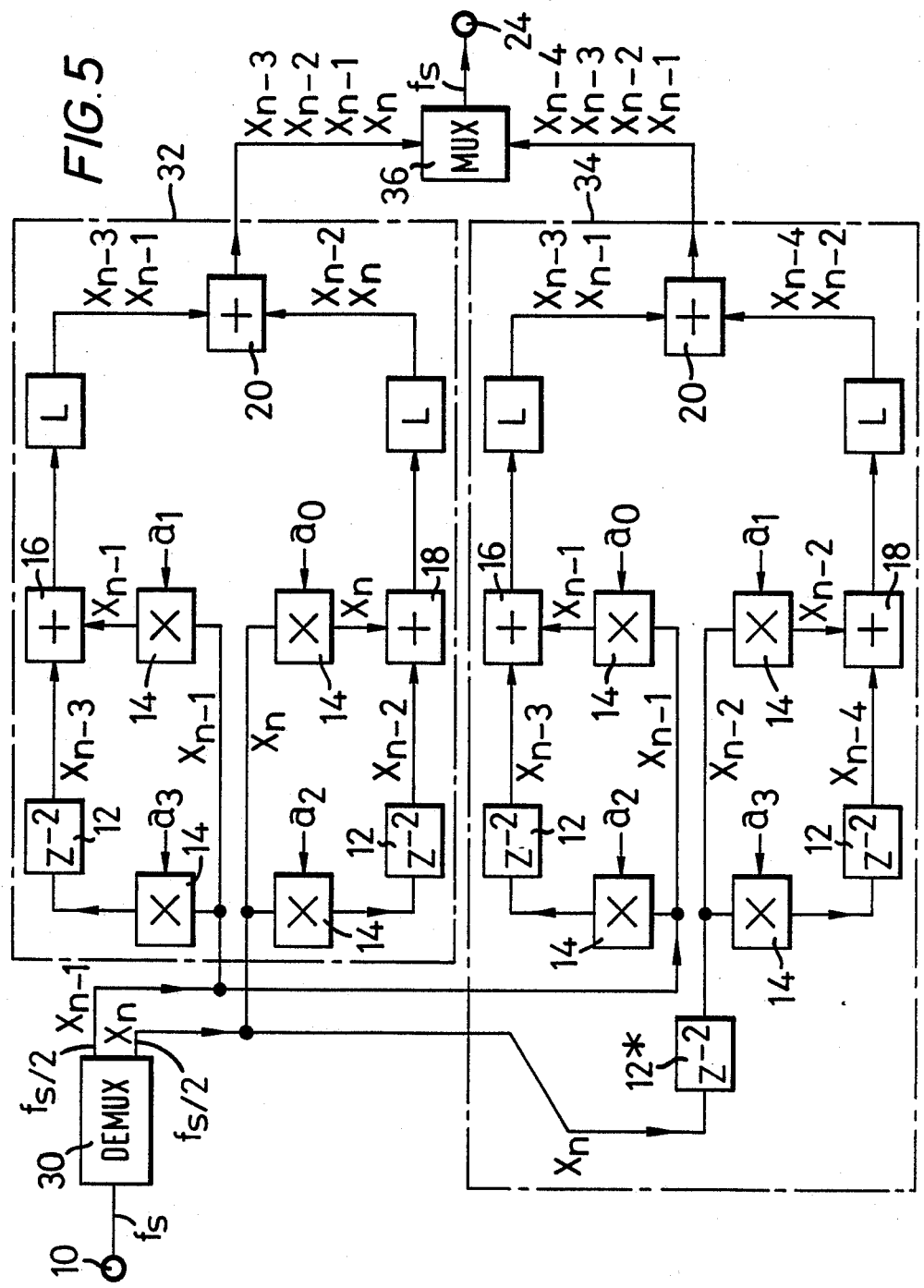

TWO-DIMENSIONAL FINITE IMPULSE RESPONSE FILTERS

BACKGROUND OF THE DISCLOSURE

1. Field of the Invention

This invention relates to two-dimensional finite impulse response filters.

2. Description of the Prior Art

It is known to use two-dimensional finite impulse response (2D FIR) filters to effect two-dimensional filtering of an input data signal that comprises a stream of digital words and that is representative of a two-dimensional image. The signal may, for example, be a television or video image. As is known to those skilled in the art, and as is explained more fully hereinbelow, a 2D FIR filter is operative to process successive sets of consecutive words of the input signal, each successive set being offset by one word from the preceding wet, to generate successive words of a filtered output signal. The processing involves the use of adders and multipliers, each multiplier being operative to multiply a word by a weighting coefficient. The operations performed by the multipliers and adders take time. For input signals having a low data rate, the operating times of the multipliers and adders are insignificant. Accordingly, an FIR filter can, in this case, comprise a single multiplier and a single adder and means for causing each of a plurality of multiplication and summing operations to be performed sequentially by the single multiplier and single adder during the processing of a set of consecutive words of the input signal. At higher data rates, at which the operating times of the multiplier and adder become significant, this becomes impossible. As the input signal data rate increases, it becomes necessary to employ a single multiplier and a single adder for each computational step. However, as the input signal data rate is increased further, it will transpire eventually that the filter will fail to operate because the signal is too fast to be processed by the slowest components of the filter. (Usually, but not always, the slowest components are the multipliers). That is to say, conventional 2D FIR filters have a maximum operating rate which is determined by the slowest operating components thereof, and cannot process a signal having a data rate higher than the maximum operating rate.

SUMMARY OF THE INVENTION

An object of the invention is to provide an improved two-dimensional finite impulse response (2D FIR) filter.

Another object of the invention is to provide a 2D FIR filter that can handle an input signal whose speed or data rate is too high to be handled by a conventional 2D FIR filter.

A further object of the invention is to provide a 2D FIR filter which can handle an input signal whose speed or data rate is too high to be handled by a conventional 2D FIR filter, and yet which can be constructed from components whose maximum data handling rates need be no greater than those of components used in conventional 2D FIR filters.

The present invention provides a two-dimensional finite impulse response (FIR) filter that comprises a demultiplexer which demultiplexes an input data signal comprising consecutive digital words into p (e.g. 2) slower data signals each having a slower data rate equal to $1/p$ (e.g. $\frac{1}{2}$) of the data rate of the input data signal and each comprising every $p^{th}$ word (e.g. every alternate word) of the input data signal. The 2D FIR filter further comprises p (e.g. 2) FIR filter portions each connected to receive all of the slower data signals. All of the p filter portions operate at the slower data rate simultaneously to effect horizontal filtration by periodically processing sets of consecutive words of the input data signal, the sets of consecutive words being processed at any one time by the respective filter portions being offset with respect to one another by one word in the horizontal direction. A multiplexer is connected to receive output signals of the filter portions to form a filtered output data signal having a data rate equal to that of the input data signal. By virtue of the input signal being demultiplexed into p (e.g. 2) slower rate signals, and by virtue of the fact that p sets of consecutive words of the input signal are processed simultaneously at the slower data rate, the maximum operating speed of a filter in accordance with the invention is increased by a factor of p (e.g. 2) relative to a conventional (non-multiplexed) 2D FIR filter.

In accordance with preferred embodiments of the invention described in detail hereinbelow, the p filter portions are of substantially identical construction and comprise respective circuit assemblies such as respective circuit boards or cards. Preferably, the demultiplexer and/or multiplexer is constructed in the form of p like portions and each such portion is physically associated with a respective one of the p filter portions, the filter portions and the associated like portions of the demultiplexer and/or multiplexer comprising respective circuit assemblies such as boards or cards. In this way, at least the filter portions, and preferably respective parts of the whole 2D FIR filter, are of substantially identical construction, whereby the filter can be assemblied from substantially identical "building blocks", which can considerably simplify design and/or manufacture.

The above, and other objects, features and advantages of this invention will be apparent from the following detailed description of illustrative embodiments which is to be read in connection with the accompanying drawings.

BRIEF DESCRIPTION OF THE DRAWINGS

FIG. 3 shows an FIR filter of transposed form;

FIGS. 4 and 5 show multiplexed FIR filters of direct form and transposed form, respectively;

FIGS. 6 and 7 show portions of a visual image and illustrate how sets of words of a digital signal representing that image are processed in one-dimensional and two-dimensional FIR filters;

DESCRIPTION OF THE PREFERRED EMBODIMENTS

As is well known to those skilled in the art, a finite impulse response (FIR) filter is a filter which is capable of filtering an input data signal which comprises a stream of consecutive or adjacent data items or words each comprising n bits. (Each word may, for example, comprise a digital sample of an analog signal). The filter comprises a plurality of delay elements which, in effect, "tap" the input data signal so that successive sets of adjacent words can be processed to form successive words of an output signal which is a filtered version of the input signal. Specifically, in a manner known to those skilled in the art, the tapped delayed words making up each set are cross multiplied with respective weighting coefficients and then summed together to perform an operation which is equivalent to the mathematical operation of convolving the Fourier transform of the desired frequency response of the filter (as represented by the weighting coefficients) with the frequency spectrum of the input data signal so as to modify the frequency spectrum of the signal.

An FIR filter is similar in some respects to an infinite impulse response (FIR) filter, the principal difference being that the time response of an FIR filter to an impulse is always finite.

Figure 1:
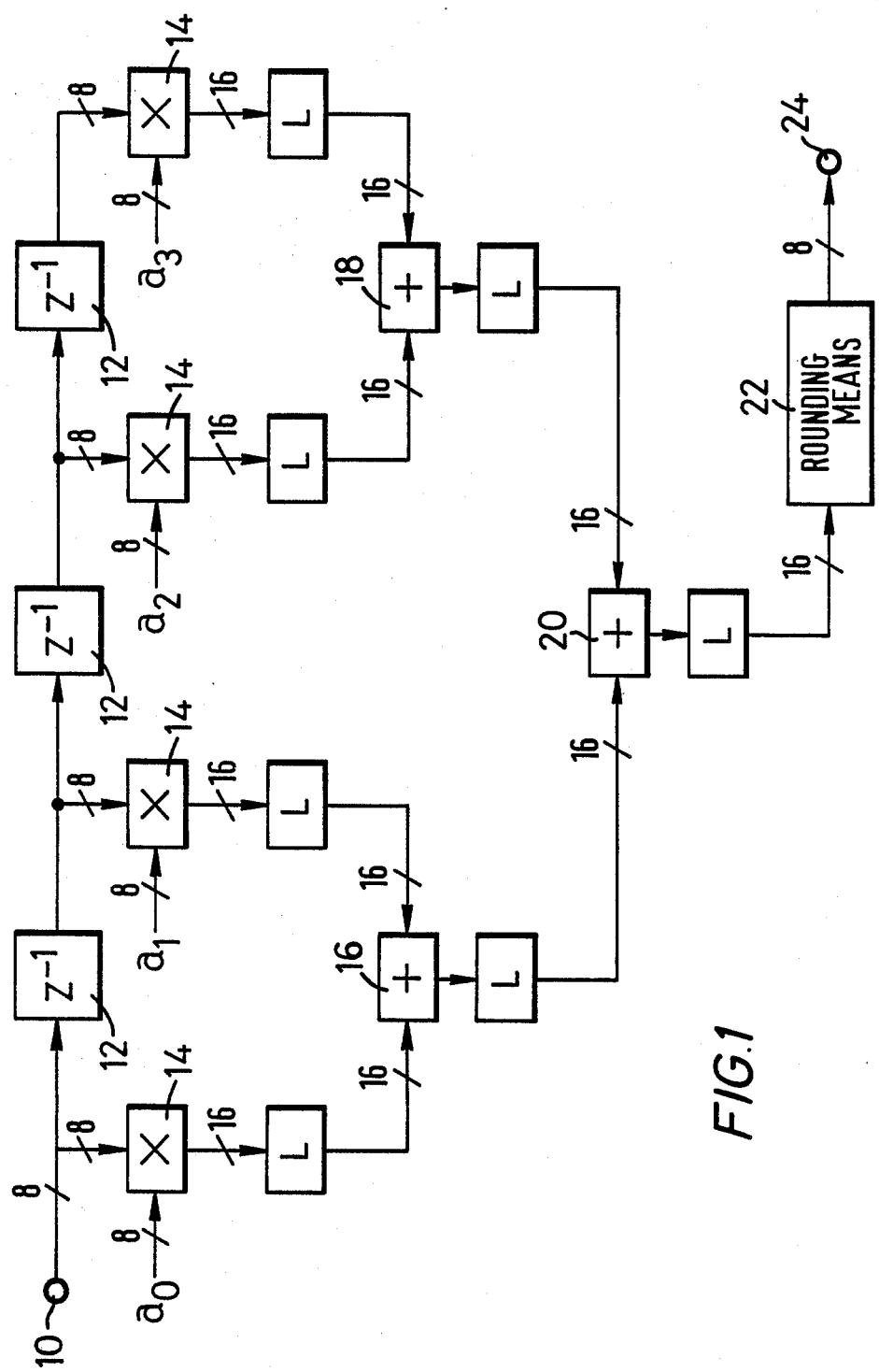
FIG. 1 shows an FIR filter of direct form.

One form of FIR filter is shown in block schematic form in FIG. 1. An input data signal comprising a stream of (say) 8-bit words or bytes is applied to an input port or terminal 10. Since the bits of each word can be considered to arrive in parallel and since the words are transferred between the components of the circuit of FIG. 1 in parallel, it should be appreciated that the various lines shown in FIG. 1 (and in the subsequent figures) are in fact busses or highways having the appropriate bit capacity. Each word may for example comprise a digitized sample of an analog signal which is sampled at a frequency fs. The signal is passed to three tandem connected delay elements 12, each of which subjects the signal to a delay $Z^{-1}$ which is equal to 1/fs, i.e. to the spacing between adjacent words. The delay elements 12 may comprise respective 8-bit latches which are supplied with clock or synchronizing signals at the frequency fs from a clock pulse source (not shown) which is connected also to the other circuit elements shown in FIG. 1 to synchronize their operation. Consequently, the delay elements 12 "tap" respective consecutive words from the input data signal so that, for each word of the input signal, a set of consecutive or adjacent words of the input signal are applied to first inputs of respective multipliers 14. (In practice, the number of words in each set will generally be considerably higher than four. However, restricting the size or number of taps to four simplifies the presentation of FIG. 1. The number of taps (and therefore the number of input words in each set) can be increased indefinitely by adding further delay elements 12, further multipliers 14 and so on).

In the multipliers 14, each respective word of each sets is multiplied by a respective one of a plurality of weighting coefficients $a_0$ to $a_3$ (in 8-bit form) which are applied to second inputs of the respective multipliers and which are calculated in order to give the filter a desired response. If the filter response is not to vary, the weighting coefficients are invariant. If it is desired to vary the filter response, means may be provided to vary correspondingly the values of the weighting coefficients.

After a set of words tapped from the input data signal have been multiplied by the weighting coefficients in the multipliers 14, it is necessary to sum them to form a word of an output data signal which is a filtered form of the input signal. This can be accomplished, as shown in FIG. 1, by adders 16, 18 and 20. The adders 16 and 18 each sum together the outputs of a respective pair of the multipliers 14 and the adder 20 sums together the outputs of the adders 16 and 18.

Various latches L are incorporated where shown in the circuit of FIG. 1. These latches, which may (like the delay elements 12) be arranged to delay their respective input signals by an amount equal to $Z^{-1}$, are present only in order to preserve correct synchronization of the various computational steps, that is to ensure that all the words arriving at the respective multipliers 14 are subjected to appropriate delays in subsequent processing. At low data rates (see below) they may not be needed.

The filter of FIG. 1 is operative to process simultaneously successive sets of four adjacent words of the input signal, each set being offset by one word, to form words of the output signal. That is to say, if the input signal comprises successive words $x_0$, $x_1$, $x_2$, $x_3$, $x_4$, $x_5$ etc. the filter first processes the set of words $x_0$ to $x_3$ to produce one output word (i.e. one word of the output signal), then processes the set of words $x_1$ to $x_4$ to produce the next output word, and so on.

Consequently, at the output of latch L connected to the output of the adder 20, there is produced a stream of output words that constitute the output signal which is a filtered version of the input signal. The output signal is, of course, delayed with respect to the input signal. Also, since each multiplier 14 is operative to multiply an 8-bit word by an 8-bit weighting coefficient to produce a 16-bit output word, the words appearing at the output of the latch L connected to the output of the adder 20 are in 16-bit form. It may be acceptable for the output signal to be in 16-bit form. However, if it is desired that the output signal should be in 8-bit form, the output signal from the adder 20 may be passed to a rounding means 22 which "rounds-off" or converts the output signal to 8-bit form before it is applied to an output terminal 24.

Figure 2:
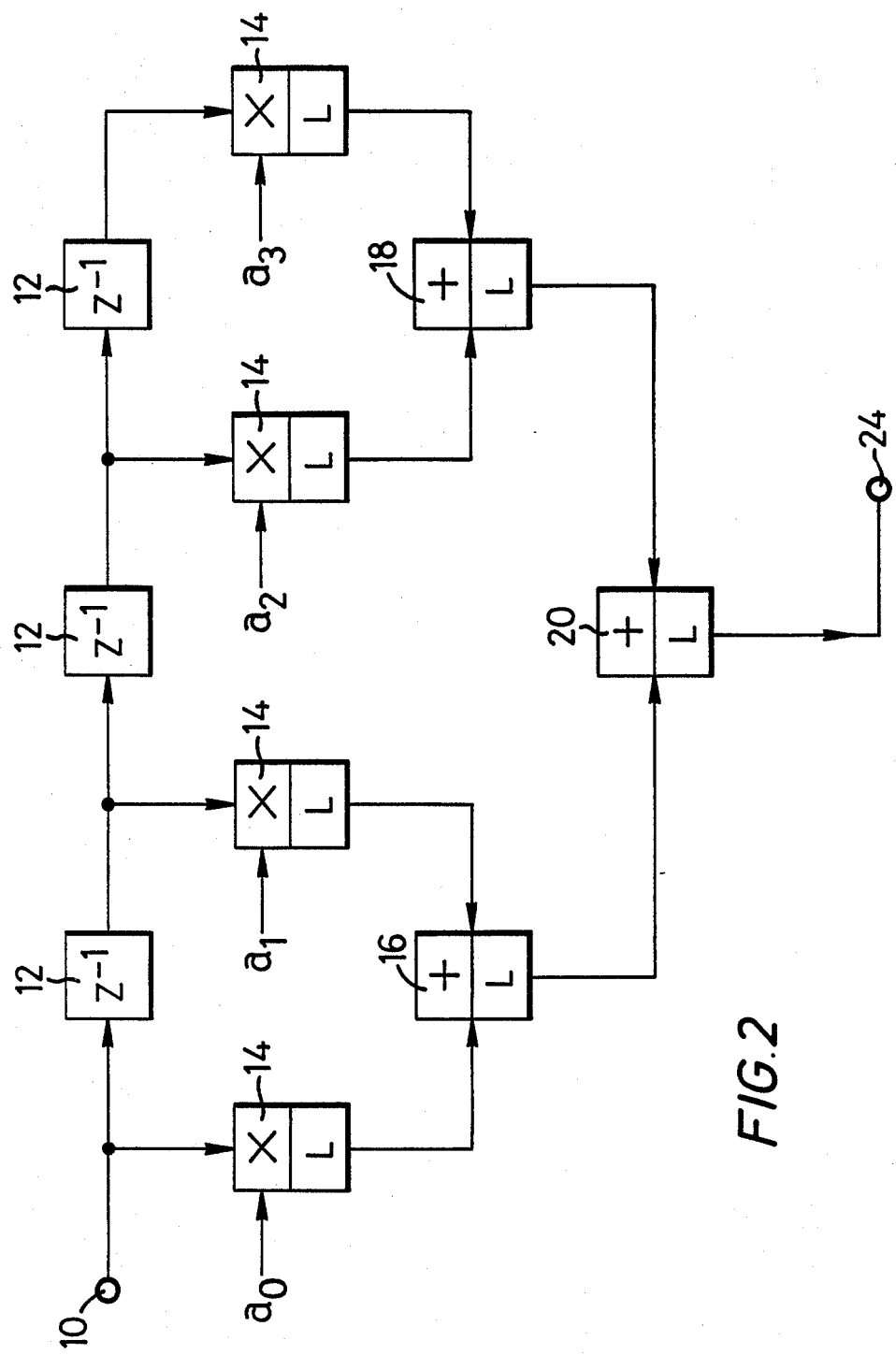
FIG. 2 is a simpler representation of the FIR filter shown in FIG. 1.

As indicated above, the latches L are associated with respective ones of the multipliers 14 and adders 16, 18 and 20 only to preserve synchronization and do not, at least in the same way as the multipliers 14 and adders 16, 18 and 20, take any direct part in the filtration operation performed by the filter. Consequently, FIG. 1 may be comprehended more readily if the latches L are shown incorporated in their respective associated multipliers and adders. FIG. 2 is a modified version of FIG. 1 with the latches L shown incorporated in their respective associated multipliers and adders. Also, since its presence if not essential to the operation of the filter, the rounding means 22 is not shown in FIG. 2.

The FIR filter shown in FIGS. 1 and 2 is a so-called "direct form" filter. However, exactly the same filtration operation as that performed by the filter of FIGS. 1 and 2 can be performed by a so-called "transposed form" of the filter shown in FIG. 3. In the case of FIG. 3, the same word of the input signal is applied simultaneously to all of the multipliers 14, and the delay or tapping effect necessary to ensure that each output word results from the processing of a set of consecutive input words is achieved subsequent to multiplication with the weighting coefficients and intermediately of the summation operation performed by the adders 16, 18 and 20. Nonetheless, as is known to those skilled in the art, and as can be demonstrated mathematically, the results is the same as with the direct form of filter shown in FIG. 1 and 2.

As described above, an FIR filter is operative periodically to multiply a set of relatively delayed words of an input signal (direct form) or a single word of the input signal (transposed form) by a plurality of weighting coefficients and to sum the resultant products to produce successive output words of an output signal. The output words must of course be created at the same rate or speed at which the input words arrive. If the rate at which the input words arrive is slow relative to the speed of operation of the circuits used to perform multiplication and summation, then considerable economy in hardware can be achieved by using a single multiplier and/or a single adder to perform the necessary steps of multiplication by the weighting coefficients and summation of the results. (That is to say, in the circuits of FIGS. 1 to 3, the operations performed by the respective multipliers 14 would be performed by a single multiplier which would effect multiplication with each of the weighting coefficients in turn, and/or the operations performed by the respective adders 16, 18 and 20 would be performed by a single adder which would effect the addition operations thereby performed in turn.) At higher speeds, this becomes impossible. As the input data speed approaches the maximum speed of operation of the circuitry it becomes necessary, as shown in FIGS. 1 to 3, to use a single multiplier and a single adder for each computational step and to employ latches to store the results of the intermediate multiplication products and addition sums to allow multiplication and addition to be pipelined. The maximum speed of operation of the filter circuits of FIGS. 1 to 3, and therefore the maximum signal speed which they can handle, is limited by the maximum speed of operation of the slowest component, which is usually (but not necessarily) the multipliers 14.

Figure 4:
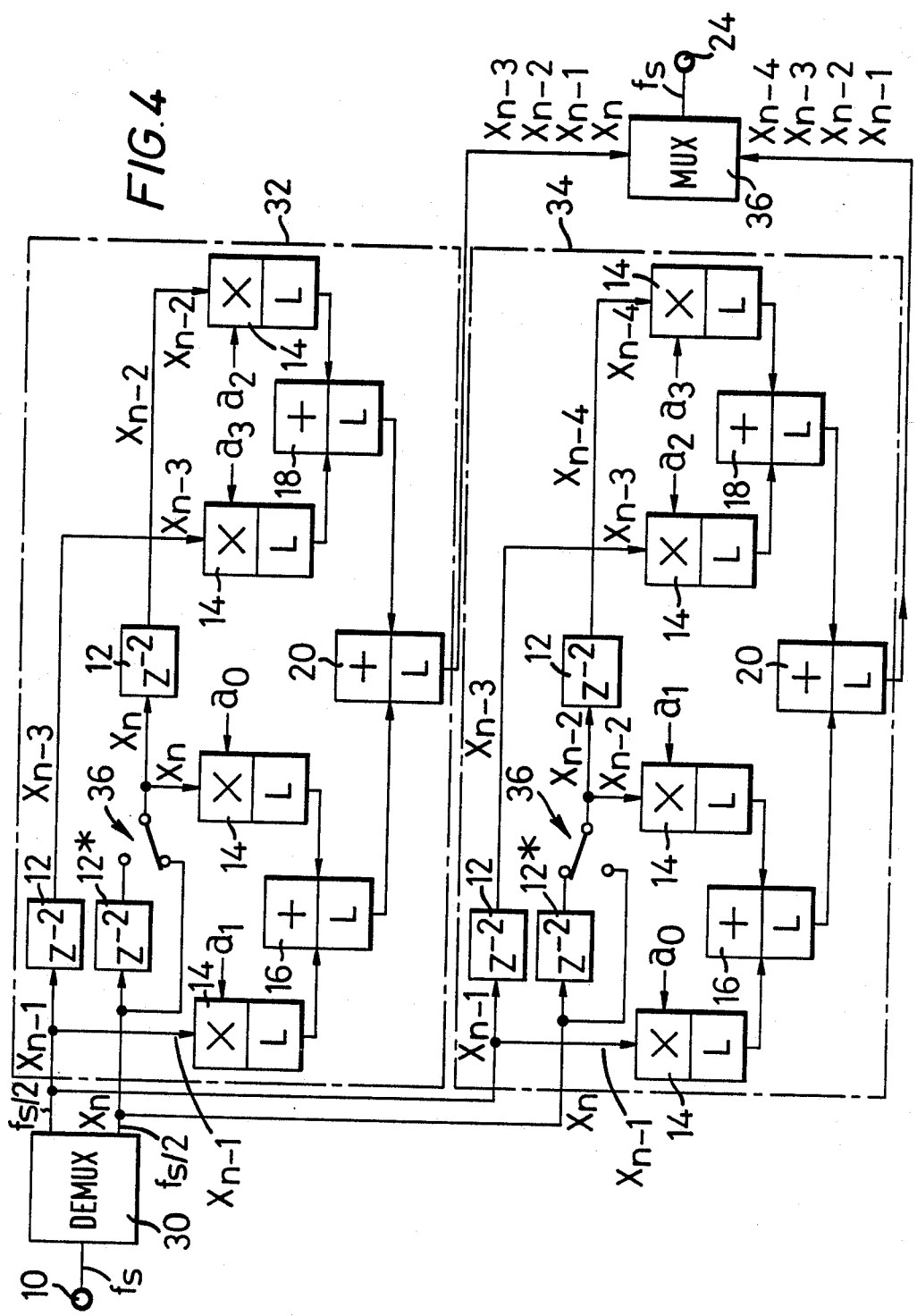

FIGS. 4 and 5 of the accompanying drawings show modified filters which are based on the filters of FIGS. 2 and 3, respectively, and which can operate at speeds higher than the maximum speed of operation of the slowest circuit (e.g. the multipliers). This is achieved by demultiplexing the input data signal into p individual slower signals (p=2 in the illustrated examples) each having a data rate equal to 1/p of the data rate of the input signal and each comprising every $p^{th}$ word of the input signal. The slower rate data signals are applied to p individual filter sections which are substantially the same as each other. Each filter section is operative to effect filtration, as described above with reference to FIGS. 1 to 3, by periodically processing sets of consecutive or adjacent words of the input signal. The filter sections process respective sets of adjacent input words simultaneously with one another. The sets of adjacent words processed at any one time by the respective filter sections are offset with respect to one another by one word. Thus, at any one time, two or more offset sets of input words (e.g. $x_0$ to $x_3$ and $x_1$ to $x_4$) are processed in parallel by the respective filter sections. This processing takes place at a speed equal to 1/p of the input data rate, which gives rise to the advantage that the maximum operating speed of the components of the filter (and therefore that of the overall filter) is effectively increased by a factor equal to p, as compared to the filters of FIGS. 1 to 3, in that the time available for processing is increased by the factor p. After the parallel processing at the slower rate, the output signals of the filter sections are multiplexed together to form a filtered output signal having a data rate equal to that of the input data signal.

The FIR filters of FIGS. 4 and 5 will now be described in more detail.

Considering first FIG. 4, the input data signal applied to the input terminal 10 (word rate=fs) is applied to a demultiplexer 30 which splits it into two slower data signals each having a slower word rate equal to fs/2. Each of the slower data signals comprises alternate words of the input data signal.

Both the slower data signals are passed to each of a pair of filter sections 32,34, each of which is similar to the direct form of filter shown in FIG. 2, so that all the input words are supplied to each of the filter sections. The frequency of the clock signals applied to the delay elements 12, multipliers 14, adders 16, 18 and 20 and latches L is equal to fs/2, so that these elements operate at a data rate which is half that in the cases of FIGS. 1 to 3. The delay time of each of the delay elements 12 is thus represented as $Z^{-2}$, where $Z^{-2}=2(Z^{-1})$. In other words, the delay time of each of the delay elements 12 is equal to twice the word spacing of the input signal.

Output signals from the respective filter sections 32,34 (which represent alternate words of the filtered output signal) are multiplexed together by a multiplexer 36 to provide the filtered output signal (at the input signal data rate) at the output terminal 24.

The filter sections 32,34 are substantially identical, except that an item 36 shown symbolically as a switch is in respective different positions in the two sections. In the filter section 32, the switch 36 is in such a position that the preceding delay element 12* is bypassed and therefore inoperative, whereas in the filter section 34 the switch is in such a position that the preceding delay element 12* is operative. (As explained below, the different positions of the switch 36 are necessary in order to preserve appropriate delay relationships as between the two filters). The fact that, save for the need to alter the setting of the switch 36, the filter sections 32,34 are identical, leads to the significant further advantage that the filter can be constructed using substantially identical building blocks or assemblies, which is helpful as regards both design and manufacture. Thus, for example, the two filter sections 32,34 can comprise identical or almost identical circuit boards or cards. In hardware terms, the item 36 may be in fact a switch. Alternatively, it may comprise means enabling the wiring pattern of the printed circuit board readily to be adjusted to achieve either of the two required alternative circuit configurations (delay element 12* in or out of circuit), in which case it might be possible not to include the delay element 12* in circuit boards intended to form the filter section 32. Whatever the practical form of implementation of the switch 36, it will be appreciated that the advantage of substantial identity between the filter sections 32,34 is preserved.

The operation of the circuit of FIG. 4 will now be described. Assume that, at a particular point in time, the words of the input signal available at the outputs of the demultiplexer 30 are $x_n$ and $x_{n-1}$, respectively. (Since, as explained previously, each of the slower rate output signals of the demultiplexer 30 comprises alternate words of the input signal, the words $x_n$ and $x_{n-1}$ are adjacent or consecutive words of the input signal). The words $x_n$ and $x_{n-1}$ are applied to both of the filter sections 32 and 34. Since the delay elements 12 impose a delay equal to two words (at the input data rate), it can readily be seen that the four words applied at the time in question to the four multipliers 14 in the filter section 32 are, reading from left to right in FIG. 4: $x_{n-1}, x_n, x_{n-3}, x_{n-2}$. The weighting coefficients are applied to the multipliers 14 in a corresponding order, namely $a_1, a_0, a_3, a_2$, so that the adder 20 of the filter section produces an output word which is based on the set of four adjacent input words $x_{n-3}, x_{n-2}, x_{n-1}$ and $x_n$ with the individual words of the set appropriately weighted.

Likewise, it can be seen that the output word produced by the adder 20 of the filter section 34 is based on the set of four adjacent input words $x_{n-4}, x_{n-3}, x_{n-2}$ and $x_{n-1}$ with the individual words of the set appropriately weighted.

That is, the output words produced at the same time (at the slower data rate) by the adders 20 are based on two sets of four adjacent input words, which sets are offset from one another by one word, this offset being produced by the delay element 12* which is present (or operative) only in the filter section 34. Consequently, when the output words are multiplexed back together by the multiplexer 36, the result will be a filtered output signal which will be the same as a signal that would have been produced by a single filter operating at twice the speed. However, instead of producing each output word serially in a maximum processing time (clock period) of $Z^{-1}$, as is the case for the filters of FIGS. 1 to 3, the filter of FIG. 4 produces a pair of output words in parallel or simultaneously in a maximum processing time (clock period) of $Z^{-2} (=2(Z^{-1}))$, so that the time available for processing is increased by a factor of 2.

The filter of FIG. 5 operates in the same manner as that of FIG. 4, except that in this case the two filter sections 32,34 each comprise substantially identical filters which are each similar to the transposed form of filter shown in FIG. 3. Again, the filter section 34 needs the extra delay element 12*. In FIG. 5, no such delay element 12* is provided in or for the filter section 32. However, as in FIG. 4, it is possible for both of the filter sections 32 and 34 to be provided with a delay element 12* and a switch or the like (not shown) to enable the element 12* to be eliminated or made inoperative in the filter section 32 and made operative in the filter section 34.

It can be seen from inspection of FIG. 5 that, for the same example of input words $x_n$ and $x_{n-1}$ available at the outputs of the demultiplexer 30, once again the adder 20 of the filter sections 32,34 produce output words based on respective sets of adjacent input words, with the two sets being offset by one word.

As will by now perhaps be appreciated, a greater reduction in the signal processing speed of the filter hardware with respect to the input signal speed can be achieved in the case of FIG. 4 or FIG. 5 by demultiplexing the input signal into more than two slower rate signals and by making use of a correspondingly greater number of filter sections, which are again preferably of substantially identical construction.

In summary, each of the filters of FIGS. 4 and 5 has the advantage that the signal processing speed of the filter hardware is reduced to at least half the speed of the input signal so that the maximum signal speed handling limitation imposed by the slowest components of the hardware (usually the multipliers) is greatly eased. Furthermore, the filter hardware is implemented in an efficient manner in that it can be constructed by replication of a common building block (filter section), thereby greatly simplify design and manufacture.

It is in fact possible to provide one demultiplexer 30 and multiplexer 36 for each filter section 32,34 or to design these components so that like parts of each are associated with each filter section. In this way, possibly at the cost of slight circuit redundancy, the advantage arises that the whole of a circuit as described with reference to FIG. 4 or 5 can be constructed from two or more substantially identical building blocks or assemblies which may for example take the form of circuit boards or cards.

In some cases, a signal to be processed by an FIR filter may have significance in the spatial sense. For example, the signal may represent a two-dimensional image, for instance a television or video image. The signal may in this case comprise a series of words which represent successive image samples along a first horizontal line of the image, such series being followed by further series which represent images samples along successive horizontal lines spaced vertically from the first line, whereby the signal as a whole represents a single image or one of a plurality of successive images (e.g. fields of a video signal).

FIG. 6 shows an arbitrary portion of a visual image. It is assumed that the image is scanned by a video camera or the like to produce an analog video signal and that the analog signal is sampled periodically to produce a digital video signal comprising successive words each representing a respective successive one of the samples. In FIG. 6, the crosses represent points where samples are taken. Thus, the digital signal will comprise five successive words corresponding to the crosses in the first line of FIG. 6, further words corresponding to the number of samples per line (less five), five successive words corresponding to the crosses in the second line of FIG. 6, and so on. Thus, the spacing between crosses (samples) in the horizontal direction is equal to one sampling interval or period (1/fs), whereas the spacing between crosses (samples) in the vertical direction is equal to the number of samples per line, which may, for example, be equal to 864 times the sampling period or interval (1/fs).

Since they process at one time only a predetermined set of consecutive or adjacent words, successive sets being offset by one word, FIR filters as so far described will function only to filter such a signal in the horizontal dimension, that is along the direction of scanning. Thus, for example, assuming for simplicity that the filter only processes three adjacent samples at one time, it will first process (for example) the set of three samples shown at 40 in FIG. 6, then the set of three samples shown at 42, then the set of three samples shown at 44, and so on.

There are cases, however, for example in the creation of digital video effects, where two-dimensional (2D) filtering is required. That is to say, the signal must be filtered both in the horizontal dimension (the direction of scanning) and in the vertical dimension (the direction orthogonal to the direction of scanning).

One known type of 2D FIR filter, known as an array filter, processes successive two-dimensional arrays of words of the signal corresponding to at least part of the image, the successive arrays being offset by one word in the horizontal (scanning) direction. If, for simplicity, the array is considered to be a 3×3 array (in practice it would generally be considerably larger), the array filter would first process (for example) the 3×3 array of nine samples shown at 46 in FIG. 6, then the 3×3 array shown at 48, then the 3×3 array shown at 50, and so on. The nine (3×3) elements in each successive array are "picked off" or isolated from the signal and processed by cross-multiplying them with weighting coefficients and then summing them, generally as described above, though in this case it is necessary to use delay elements having a delay equal to a whole line of the image as well as delay elements having a delay equal to the sampling period.

The design of 2D FIR filters of the array type is somewhat complex because, as will be appreciated, the weighting coefficients in general have significance in both dimensions. A so-called "variable separable" 2D FIR filter is easier to design in that, in essence, it effects filtration only along lines (one dimensional arrays) extending in the vertical and horizontal dimensions, respectively, whereby the weighting coefficients for the vertical and horizontal dimensions largely can be designed independently of one another.

Pursuing the simple example of processing only three samples in each dimension, and referring now to FIG. 7, a variable separable 2D FIR filter may operate as follows. To effect horizontal filtration, it will process successive sets of samples 40, 42 and 44 in the same way that a 1D FIR filter functions as described above with reference to FIG. 6. The samples of each set 40, 42 and 44 are spaced by one sample in the horizontal (scanning) direction and the successive sets are spaced by one sample in the same direction. To effect vertical filtration, it processes successive sets of three samples, e.g. as shown at 52, 54 and 56 in FIG. 7, the samples in each set being spaced by one sample in the vertical direction and the successive sets being spaced by one sample in the horizontal direction. Horizontal and vertical filtration are effected in turn, in either order. The weighting coefficients for the two lines or linear arrays of three samples extending in the horizontal and vertical dimensions, respectively, are calculated independently from the respective, independent aspects of achieving filtration in the two respective dimensions.

Figure 8:
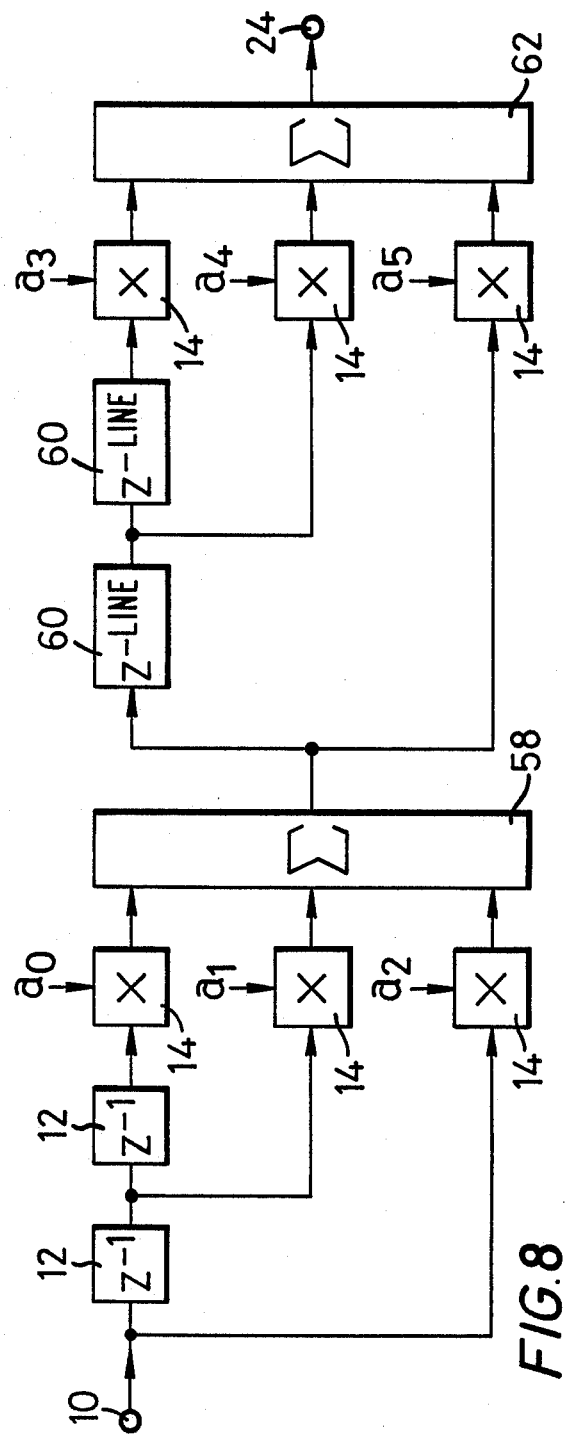
FIG. 8 shows a variable separable type two-dimensional FIR filter.

A form of implementation of the variable separable 2D FIR filter described with reference to FIG. 7 is shown in FIG. 8. The input signal on the input terminal 10 is processed first by a horizontal FIR filter comprising two sample or input word period ($Z^{-1}$) delay elements 12, three multipliers 14 (weighting coefficients $a_0$, $a_1$ and $a_2$) and summing means 58 (which may, for example, comprise several adders as described above with reference to FIGS. 1 to 5). The horizontal filter processes in turn sets of words such as those 40, 42 and 44 of FIG. 7. The horizontally filtered signal is then processed by a vertical FIR filter comprising two line ($Z^{-LINE}$) delay elements 60, three further multipliers 14 (weighting coefficients $a_3$, $a_4$ and $a_5$) and a summing means 62 (which may, for example, comprise several adders as described above with reference to FIGS. 1 to 5). The vertical filter processes in turn sets of words such as those 52, 54 and 56 of FIG. 7. Consequently, a two-dimensionally filtered output signal is developed at the output terminal 24. It should be noted that it is not necessary for horizontal and vertical filtration to be effected in that order. The order could be reversed.

Embodiments of the invention that will now be described comprise variable separable 2D FIR filters which incorporate the feature of being capable of processing high speed input signals at a lower speed by multiplexing and hardware replication as described above with reference to FIGS. 4 and 5 for one dimensional FIR filters. This is done, in essence, by modifying the filters of FIGS. 4 and 5 or like filters by associating with each of the filter sections 32 and 34 (which act as horizontal filters) a vertical FIR filter which cooperates with the horizontal filter section to form a two-dimensional filter portion, the vertical FIR filter also operating at the slower rate.

As explained above, in the demultiplexed horizontal FIR filter of FIG. 4 or FIG. 5 the input signal is split up or demultiplexed into two slower signals each comprising alternate words of the input signal. However, each such slower signal is not processed only by a respective one of the filter sections 32,34. Were this the case, information would be lost because the output words would be based on sets of alternate (rather than adjacent or consecutive) input words. In fact, both slower signals are applied to each of the filter sections 32,34 so that each filter section processes a set of adjacent words, but at the slower rate. This can be more clearly appreciated by reference to FIG. 9, which is the same as FIGS. 6 and 7 except that it is drawn for a two-way demultiplexed filter structure and the crosses are replaced by the numbers 1 and 2, where the numbers 1 represent the alternate samples or input words that appear in one of the slower rate output signals of the demultiplexer and the numbers 2 represent the other alternate samples or input words that appear in the other output signal of the multiplexer. In a demultiplexed horizontal FIR filter, assuming again for simplicity that only three adjacent words are included in each processed set, four consecutive output words are for example based on the four sets of the samples or input words shown in FIG. 9 at 64, 66, 68 and 70. All four sets are successively offset by one sample with respect to one another. The two sets 64,66 (and 68,70 etc.) which are processed simultaneously by the respective filter sections 32,34 comprise sets of adjacent samples, picked off from both output signals of the multiplexer 30, which are offset from one another by one sample.

Figure 9:
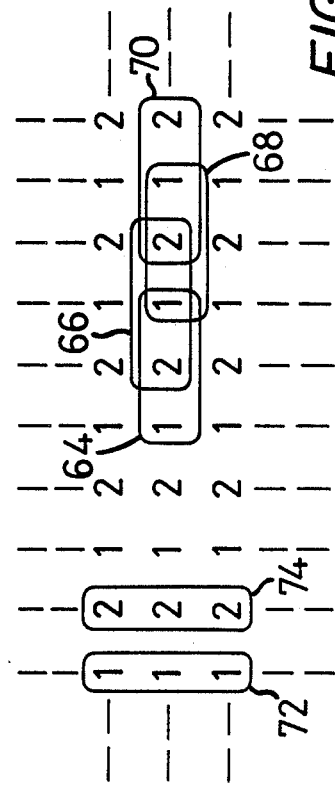
FIG. 9 shows a portion of a visual image and illustrates how sets of words of a digital signal representing that image are processed in two-dimensional FIR filters embodying the present invention.

The task of effecting vertical FIR filtration (as opposed to horizontal FIR filtration) in a 2D FIR demultiplexed filter is, as will now be explained, somewhat less complex. The two sets of input words or samples that are to be processed simultaneously must, of course, be displaced with respect to one another by one sample or input word. Two such sets are shown in FIG. 9 at 72 and 74. As can be seen, the set 72 comprises only words appearing in one of the output signal of the demultiplexer 30 (namely the words represented by the number 1) and the set 74 comprises only words appearing in the other output signal of the demultiplexer (namely the words represented by the number 2). Consequently, in a 2D FIR demultiplexed filter, though it is essential that the horizontal filters have access to all of the output signals of the demultiplexer 30, the same does not apply to the vertical filters. It is possible, though not essential, to arrange for the vertical filters to receive only respective ones of the output signals of the demultiplexer 30.

Figure 10:
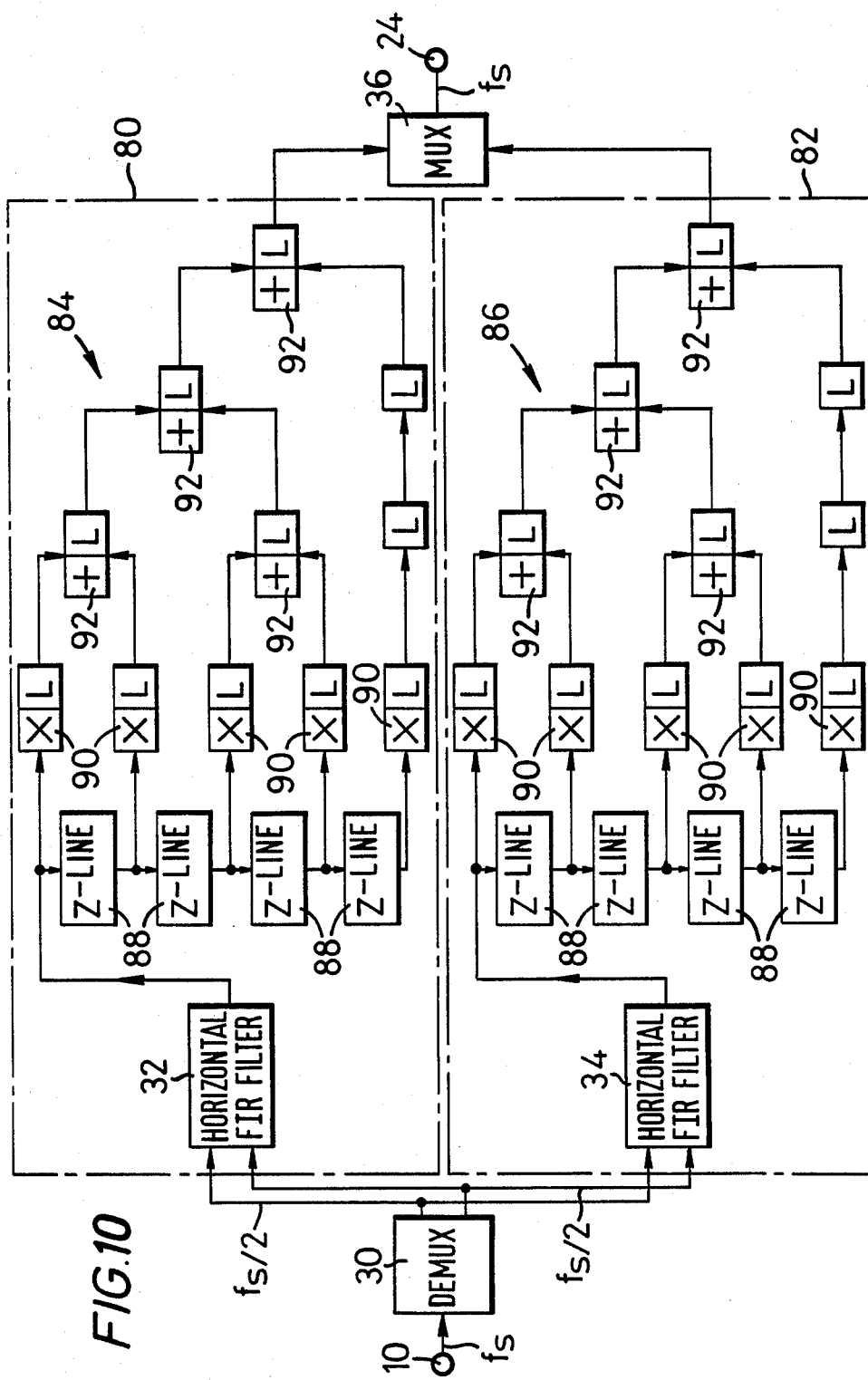
FIGS. 10 and 11 show respective variable separable type two-dimensional FIR filters embodying the present invention.

FIG. 10 shows a first 2D FIR variable separable demultiplexed filter embodying the invention. The filter of FIG. 10 includes a demultiplexer 30 and a multiplexer 36 which function in the same way as those of FIGS. 4 and 5. A pair of filter portions 80,82 are connected between the demultiplexer 30 and the multiplexer 36 as shown. Each of the filter portions 80,82 includes a respective horizontal FIR filter 32,34 which is the same as or similar to those described with reference to FIGS. 4 and 5. The horizontal filters 32,34 are connected to the demultiplexer 30 in the same way as in FIGS. 4 and 5 and function in the same manner periodically to effect simultaneous horizontal filtration of two sets of input words at the slower rate (fs/2), the two sets comprising sets of image elements or samples that are spaced horizontally (in the scanning direction) by one element or sample.

Each of the filter portions 80,82 includes a respective vertical FIR filter 84,86. Each vertical filter 84,86 is connected to receive the horizontally filtered output signal of the associated horizontal filter 32,34. The vertical filters 84,86 are of identical construction. Each of the vertical filters 84,86 comprises a plurality of line ($Z^{-LINE}$) delay elements or line stores 88, the number of elements 88 being determined by the number of "tappings" of the input signal (i.e. the number of input words spaced in the vertical direction) to be processed at any one time in the vertical filtration operation. Since the vertical filters 84,86 receive only half of the data contained in the input signal, the line delay elements (line stores) 88 of each filter need store only half of the data received. The tapped signals are multiplied with weighting coefficients (not shown) in multipliers 90 and summed together by adders 92. Latches L are included in the vertical filters 84,86 for the reason explained above with reference to FIG. 1. The various components of the vertical filters 84,86 are, like those of the horizontal filters 32,34 clocked at the slower rate (fs/2) by a clock pulse source (not shown). Thus, the vertical filters 84,86 function periodically at the slower rate (fs/2) to perform vertical FIR filtration by processing simultaneously (in parallel) two sets of image elements or samples that are spaced vertically at intervals of one line of the image, the two sets being offset by one element or sample in the horizontal (scanning) direction. Since the output signals of the horizontal filters 32,34 are, as explained above, offset by one word of the input signal, and since those signals serve as input signals to the vertical filters 84,86, the requirement that the input signals to the vertical filters be offset by one input word is satisfied.

It will be appreciated from the foregoing description that the vertical filters 84,86 are of the direct (non-transposed) form. However, it is possible instead to use vertical filters of the transposed form.

The output signals of the adders 92 (i.e. the output signals of the filter portions 80 and 82) are similar to the output signals of the adders 20 in FIGS. 4 and 5, save that they have been subjected to both vertical and horizontal filtration rather than to horizontal filtration alone.

The output signals of the adders 92 are multiplexed together by the multiplexer 36 to produce an output signal at the original (input) data rate, which signal is the same as that produced by the multiplexer 36 of FIGS. 4 and 5, save that it has been subjected to both vertical and horizontal filtration rather than to horizontal filtration alone.

Like the filters of FIGS. 4 and 5, the filter of FIG. 10 (and those described below with reference to FIGS. 11 and 12) has the advantage that, by virtue of de-multiplexing and the simultaneous processing at a slower rate of at least two sets of input words offset by one input word so as to generate two output words in parallel, the components of the filter operate at a speed which is at most one half that of the input signal, thereby enabling fast signals to be handled by relatively slow components. In other words, the maximum signal speed handling limitation imposed by the slowest components of the hardware (usually the multipliers) is greatly eased. In the two-way multiplexed arrangement shown in FIG. 10, the ratio between the speed of signal processing and the speed of the input signal is, of course, 1:2. A greater ratio (1:3 or more) can be obtained in the case of FIG. 10 (and also in the case of FIGS. 11 and 12) by demultiplexing the input signal into three or more slower rate signals and by providing a correspondingly greater number of filter portions, which are preferably of substantially identical construction.

The filter of FIG. 10 (and those described below with reference to FIGS. 11 and 12) has the further advantage that the filter portions 80,82 are of substantially identical construction, whereby the filter can be constructed from substantially identical building blocks or assemblies, which is helpful as regards both design and manufacture. The filter portions 80,82 may, for example, comprise substantially identical circuit boards or cards.

Further it is possible to provide one demultiplexer 30 and multiplexer 36 for each filter portion 80,82 or to design these components so that like parts of each are associated with each filter portion 80,82. In this way, possibly at the cost of slight circuit redundancy, the advantage arises that the whole of a circuit as described with reference to FIG. 10 (and those described below with reference to FIGS. 11 and 12) can be constructed from two or more substantially identical building blocks or assemblies, which may for example take the form of circuit boards or cards.

Figure 11:
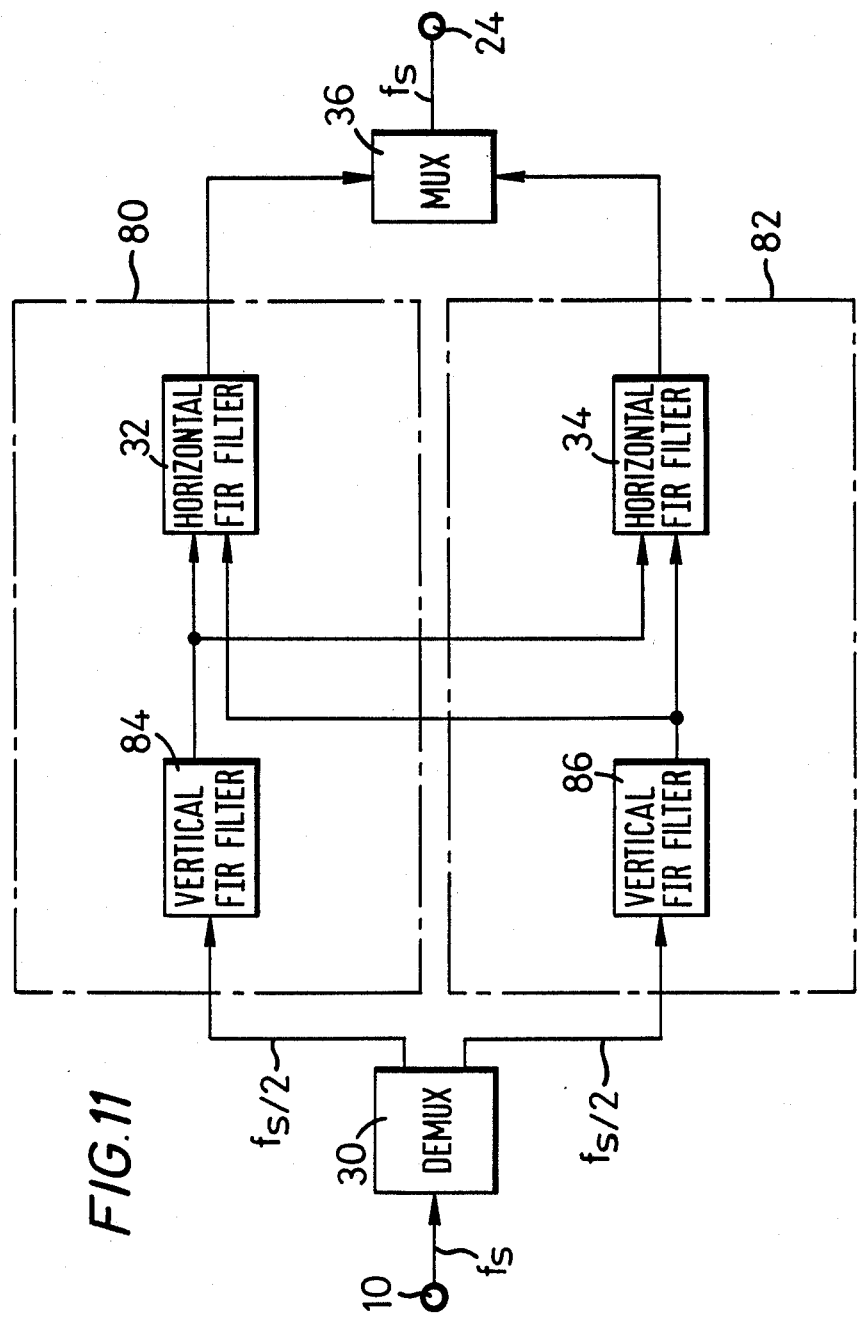

It was explained above that, in the non-demultiplexed 2D variable separable FIR filter of FIG. 8, the separate operations of horizontal and vertical filtration can be effected in either order. The same applies to the demultiplexed 2D variable separable filter of FIG. 10. Thus, the components of the filter of FIG. 10 can be re-arranged to form a filter as shown in FIG. 11 in which, in each filter section 80,82, vertical filtration is effected before horizontal filtration. In the case of FIG. 11, for the reason explained above with reference to FIG. 9, it is possible (as shown) to supply only a respective one of the slower rate output signal of the demultiplexer 30 to each of the vertical FIR filters 84,86. (That is, only a respective one of the two output signals of the demultiplexer 30 is supplied directly to each of the filter portions 80,82). However, as explained above, each of the horizontal filters 32,34 must have access to all of the words or samples of the input signal, that is it must have access to both output signals of the demultiplexer 30. To this end, in FIG. 11, after the demultiplexed output signals have been vertically filtered by the respective vertical filters 84,86 they are passed to both of the horizontal filters 32,34. Thus, as shown, the output of each of the vertical filters 84,86 is connected to both of the horizontal filters 32,34, whereby each filter portion 80,82 is supplied indirectly with the other of the output signals of the demultiplexer 30 via the vertical FIR filter of the other filter portion. Connection of the output of each of the vertical FIR filters 84,86 to both of the horizontal FIR filters 32,34 may represent a slight disadvantage from the point of view of hardware realization since it involves a need to provide data busses cross-coupling the circuit assemblies constituting the filter portions 80,82 of the filter. Therefore, although the structure of FIG. 11 possesses the same advantageous features as that of FIG. 10, namely a reduction in processing speed and the possibility of implementing the filter portions 80,82 as substantially identical circuit assemblies, the construction of FIG. 10 is preferred to that of FIG. 11.

Figure 12:
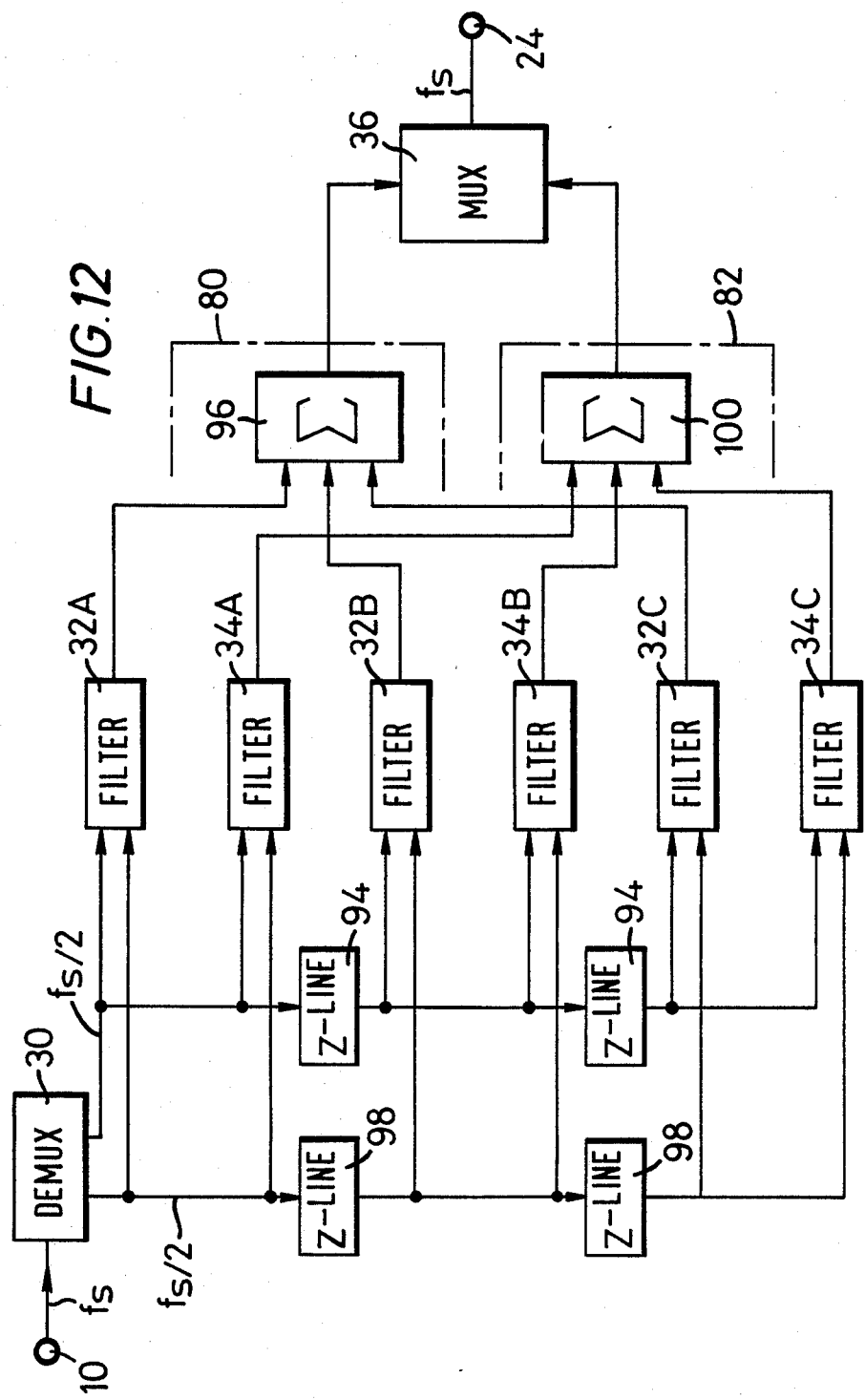
FIG. 12 shows an array type two-dimensional FIR filter embodying the invention.

The 2D FIR demultiplexed filters described with reference to FIGS. 10 and 11 are of the variable separable type. The invention is, however, applicable also to 2D FIR filters of the array type. A simple form of demultiplexed 2D FIR array filter embodying the invention is shown in FIG. 12. In pursuance of the example described above with reference to FIG. 6, the filter of FIG. 12 is designed to filter a 3×3 array, that is it processes successive 3×3 sets of samples such as those shown at 46,48 and 50 in FIG. 6, each set being offset with respect to the previous set by one word in the horizontal direction.

The filter of FIG. 12 includes a demultiplexer 30 and a multiplexer 36 which function in the same way as those of FIGS. 10 and 11 (and FIGS. 4 and 5). Also, again like those of FIGS. 10 and 11, the filter of FIG. 12 includes a pair of filter portions 80,82 connected between the demultiplexer 30 and the multiplexer 36. The filter portion 80 comprises three filters 32A,32B,32C, two line ($Z^{-LINE}$) delay element 94 and a summing means 96, these items being interconnected as shown in FIG. 12. The filter portion 82 comprises three filters 34A,34B,34C, two $Z^{-LINE}$ delay elements 98 and a summing means 100, these items being interconnected as shown in FIG. 12. In order to simplify comprehension of FIG. 12, the components of the filter portions 80,82 are laid out in a relatively intermingled manner. Therefore, in order to avoid undue complexity, the boundaries of the filter portions 80,82 are shown only in part in FIG. 12. However, it can readily by appreciated from a study of FIG. 12 that the filter portions 80,82 are of substantially identical construction. Therefore, as previously indicated, the filter of FIG. 12 can be constructed from substantially identical building blocks or assemblies.

The filters 32A,32B,32C of the filter portion 80 of FIG. 12 are the same as or similar to the horizontal FIR filter 32 of the filters of FIGS. 10 and 11 (and FIGS. 4 and 5). The filters 34A,34B,34C of the filter portion 82 of FIG. 12 are the same as or similar to the horizontal FIR filter 34 of the filters of FIGS. 10 and 11 (and FIGS. 4 and 5).

The filters 32A,34A are connected to the multiplexer 30 in the same way as are the filters 32,34 in FIG. 10 and function in the same manner periodically to effect simultaneous horizontal filtration of two sets of input words at the slower rate (fs/2). The two sets comprise sets of image elements or samples that are spaced horizontally (in the scanning direction) by one element or sample. More specifically, for the 3×3 array given by way of example, the two sets comprise the upper rows of (say) the two adjacent array sets 46 and 48 shown in FIG. 6.

By virtue of the presence of the $Z^{-LINE}$ delay elements 94,98, the filters 32B,32B and 32C,34C perform similar operations on the sets of samples constituting the middle and lower rows, respectively, of the array sets 46 and 48.

The outputs of the filters 32A,32B and 32C are summed by the summing means 96 to constitute the output signal of the filter portion 80 and the outputs of the filters 34A,34B and 34C are summed by the summing means 100 to constitute the output signal of the filter portion 100. Thus, as in the filters of FIGS. 10 and 11, during each successive clock period equal to $2(Z^{-1})$ the filter portion 80,82 produce simultaneously a pair of adjacent words of an output signal which is a two dimensionally filtered version of the input signal applied to the input terminal or port 10, the difference being that, in the case of FIG. 12, the output words are obtained by an array type filtering process rather than by a variable separable filtering process. The pairs of output words produced by the filter portions 80 and 82 are, as in the case of FIGS. 10 and 11, multiplexed together by the multiplexer 36 to produce the output signal at the original (input) data rate (fs).

In practice an array of dimensions greater than 3×3 will generally be used. The array (which need not be square) can be extended in the horizontal direction by increasing the number of delay elements or tappings in the filters 32A,32B,32C, 34A,34B,34C; and can be extended in the vertical direction by increasing the number of filters 32A,32B,32C, 34A,34B,34C and the number of line delay elements 94,98.

Also, the filter of FIG. 12 (like those of FIGS. 10 and 11) can be multiplexed to achieve a greater reduction than two (i.e. p is greater than 2) in the internal processing data rate by demultiplexing the input signal into three or more slower rate signals and by providing a correspondingly greater number of filter portions, which are preferably of substantially identical construction.

Although illutration embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A two-dimensional finite impulse response (FIR) filter comprising:

a demultiplexer for demultiplexing an input data signal comprising consecutive digital words into p slower data signals, where p is an integer greater than 1, such having a slower data rate equal to 1/p of said data rate of the input data signal and each comprising every $p^{th}$ word of said input data signal;

p FIR filter portions each connected to receive all of said slower data signals, all of said p FIR filter portions being operative at said slower data rate simultaneously to effect horizontal filtration by periodically processing sets of consecutive words of said input data signal, said sets of consecutive words being processed at any one time by the respective filter portions being offset with respect to one another by one word in the horizontal direction; and a multiplexer connected to receive output signals of said p FIR filter portions to form a filtered output data signal having a data rate equal to that of said input data signal;

wherein each of said p FIR filter portions comprises a vertical FIR filter and a horizontal FIR filter, said vertical FIR filter of said FIR filter portion has an input connected to said demultiplexer so as to receive directly only a respective one of said p slower data signals, and said horizontal FIR filter of each said FIR filter portion has p inputs of which one is connected to an output of said vertical FIR filter of the same FIR filter portion and the at least one other is connected to the output of the vertical filter of the at least one other FIR filter portion, whereby the at least one other of the p slower rate signals is received by the FIR filter portion indirectly, namely after vertical filtration in the at least one other FIR filter portion.

2. A two-dimensional FIR filter according to claim 1, wherein p=2.

3. A two-dimensional finite impuse response (FIR) filter comprising:

a demultiplexer for demultiplexing an input data signal comprising consecutive digital words into p slower data signals, where p is an integer greater than 1, each having a slower data rate equal to $1/p$ of said data rate of the input data signal and each comprising every $p^{th}$ word of said input data signal;

p FIR filter portions each connected to receive all of said slower data signals, all of said p FIR filter portions being operative at said slower data rate simultaneously to effect horizontal filtration by periodically processing sets of consecutive words of said input data signal, said sets of consecutive words being processed at any one time by the respective filter portions being offset with respect to one another by one word in the horizontal direction; and a multiplexer connected to receive output signals of said p FIR filter portions to form a filtered output data signal having a data rate equal to that of said input data signal;

wherein each of said p FIR filter portions comprises a plurality of horizontal FIR filters each corresponding to a respective row of an array of words of said input data signal and line delay means for delaying said p slower data signals by amounts corresponding to the spacing in time between said rows of said array, wherein the p horizontal FIR filters of said p FIR filter portions corresponding to each said row of said array are connected to process sets of consecutive words of said input data signal corresponding to that row, said sets being offset with respect to one another by one word in the horizontal direction, and wherein each of said p FIR filter portions comprises summing means for summing output signals from said plural horizontal FIR filters of that filter portion to produce said output signal of that filter portion.

4. A two-dimensional FIR filter according to claim 3, wherein p=2.

* * * * *

UNITED STATES PATENT AND TRADEMARK OFFICE
CERTIFICATE OF CORRECTION

PATENT NO. : 4,821,223
DATED : April 11, 1989
INVENTOR(S) : Morgan W.A. David

It is certified that error appears in the above-identified patent and that said Letters Patent is hereby corrected as shown below:

```
Column  1, line 19, change "wet" to --set--.
Column  2, line 35, change "assemblied" to --assembled--.
Column  3, line 25, change "(FIR)" to --(IIR)--;
           line 61, change "sets" to --set--.
Column  4, line 26, after "etc." insert --,--.
Column  5, line  5, change "results" to --result--.
Column  8, line 21, change "images" to --image--.
Column 10, line 49, change "signal" to --signals--.
Column 11, line 29, after "34" insert --,--;
           line 60, change "filters" to --filter--.
Column 12, line 43, change "signal" to --signals--.
Column 13, line 58, change "32B" second occurence to --34B--.
Column 14, line 42, change "such" to --each--.
```

Signed and Sealed this

Seventeenth Day of October, 1989

*Attest:*

DONALD J. QUIGG

*Attesting Officer*   *Commissioner of Patents and Trademarks*